(12) United States Patent
Chew et al.

(10) Patent No.: US 11,791,288 B2
(45) Date of Patent: *Oct. 17, 2023

(54) REINFORCED SEMICONDUCTOR DIE AND RELATED METHODS

(71) Applicant: SEMICONDUCTOR COMPONENTS INDUSTRIES, LLC, Phoenix, AZ (US)

(72) Inventors: Chee Hiong Chew, Seremban (MY); Erik Nino Tolentino, Seremban (MY); Yusheng Lin, Phoenix, AZ (US); Swee Har Khor, Kuala Lumpur (MY)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/660,941

(22) Filed: Apr. 27, 2022

(65) Prior Publication Data

US 2022/0254734 A1 Aug. 11, 2022

Related U.S. Application Data

(60) Continuation of application No. 16/886,395, filed on May 28, 2020, now Pat. No. 11,348,878, which is a
(Continued)

(51) Int. Cl.
*H01L 23/00* (2006.01)
*H01L 23/495* (2006.01)
(Continued)

(52) U.S. Cl.
CPC ........ *H01L 23/562* (2013.01); *H01L 21/4825* (2013.01); *H01L 21/78* (2013.01);
(Continued)

(58) Field of Classification Search
CPC ... H01L 23/562; H01L 21/4825; H01L 21/78; H01L 23/49513; H01L 23/49562; H01L 23/49582; H01L 23/3736; H01L 23/49579; H01L 2224/48227; H01L 2924/00; H01L 24/05; H01L 24/29; H01L 24/32; H01L 24/83; H01L 24/94; H01L 2224/038; H01L 2224/04042; H01L 2224/32245;
(Continued)

(56) References Cited

U.S. PATENT DOCUMENTS 11,348,878 B2 * 5/2022 Tolentino ................ H01L 24/83
2013/0256856 A1 * 10/2013 Mahler ............ H01L 23/49575
257/676
(Continued)

*Primary Examiner* — Patricia D Valenzuela
(74) *Attorney, Agent, or Firm* — Adam R. Stephenson, LTD.

(57) ABSTRACT

Implementations of methods of forming a plurality of reinforced die may include forming a plurality of die on a substrate and patterning a metal gang frame to form a plurality of metal plates. The plurality of metal plates may correspond to the plurality of die. The method may include coupling the metal gang frame over the plurality of die and singulating the plurality of die. Each die of the plurality of die may include the corresponding metal plate from the plurality of metal plates coupled over the plurality of die.

20 Claims, 6 Drawing Sheets

Related U.S. Application Data division of application No. 16/181,876, filed on Nov. 6, 2018, now Pat. No. 10,700,018.

(51) Int. Cl.
  *H01L 21/78* (2006.01)
  *H01L 21/48* (2006.01)
  *H01L 23/373* (2006.01)

(52) U.S. Cl.
  CPC .. *H01L 23/49513* (2013.01); *H01L 23/49562* (2013.01); *H01L 23/49582* (2013.01); *H01L 23/3736* (2013.01); *H01L 23/49579* (2013.01); *H01L 24/03* (2013.01); *H01L 24/45* (2013.01); *H01L 2224/48227* (2013.01); *H01L 2924/00* (2013.01)

(58) Field of Classification Search
  CPC . H01L 2224/45124; H01L 2224/48491; H01L 2224/83203; H01L 2224/8384; H01L 2224/83986; H01L 2224/94; H01L 23/49524; H01L 2224/291; H01L 2224/33181; H01L 2224/45147; H01L 2224/85051; H01L 29/7393; H01L 24/45; H01L 24/03
  See application file for complete search history.

(56) References Cited

U.S. PATENT DOCUMENTS

| | | |
|---|---|---|
| 2016/0276294 A1 | 9/2016 | Katkar et al. |
| 2017/0278762 A1 | 9/2017 | Kessler et al. |
| 2017/0317049 A1* | 11/2017 | Becker .................. H01L 24/03 |
| 2019/0115288 A1* | 4/2019 | Hayashi .............. H01L 21/4828 |

* cited by examiner

REINFORCED SEMICONDUCTOR DIE AND RELATED METHODS

CROSS REFERENCE TO RELATED APPLICATIONS

This application is a continuation application of the earlier U.S. Utility Patent Application to Tolentino et al. entitled "Reinforced Semiconductor Die and Related Methods," application Ser. No. 16/886,395, filed May 28, 2020, no pending, which application is a divisional application of the earlier U.S. Utility Patent Application to Tolentino et al. entitled "Reinforced Semiconductor Die and Related Methods," application Ser. No. 16/181,876, filed Nov. 6, 2018, now issued as U.S. Pat. No. 10,700,018, the disclosures of each of which are hereby incorporated entirely herein by reference.

BACKGROUND

1. Technical Field

Aspects of this document relate generally to methods of forming semiconductor die, such as an insulated gate bipolar transistor. More specific implementations involve forming a metal mask over the substrate comprising the semiconductor die.

2. Background

Semiconductor devices include integrated circuits found in common electrical and electronic devices, such as vehicles, appliances, phones, computers, other computing devices, and other electronic devices. The devices may perform a switching or rectifying function. The devices may be formed in a semiconductor wafer and singulated into a plurality of semiconductor die. Upon singulation, the die can be mounted on a package and electrically integrated with the package which may then be used in the electrical or electronic device.

SUMMARY

Implementations of methods of forming a plurality of reinforced die may include forming a plurality of die on a substrate and patterning a metal gang frame to form a plurality of metal plates. The plurality of metal plates may correspond to the plurality of die. The method may include coupling the metal gang frame over the plurality of die and singulating the plurality of die. Each die of the plurality of die may include the corresponding metal plate from the plurality of metal plates coupled over the plurality of die.

Implementations of methods of forming a plurality of reinforced die may include one, all, or any of the following:

The method may include coupling a base plate to a side of the substrate opposite the side of the substrate having a plurality of die formed thereon.

The metal gang frame may include copper.

The metal gang frame may be directly coupled to the substrate through an adhesive.

Coupling the metal gang frame over the plurality of die may include heating and compressing the metal gang frame and the plurality of die.

Singulating the metal gang frame may include sawing or laser cutting.

The plurality of die may include a plurality of insulated gate bipolar transistors.

The substrate may include a thickness that is 75 micrometers or less.

Implementations of methods of forming a plurality of reinforced die may include forming a plurality of die on a first surface of a substrate and patterning a metal gang frame to form a plurality of metal plates. The plurality of metal plates may correspond to the plurality of die. The method may include coupling the metal gang frame over the plurality of die to the first surface of the substrate, coupling a base plate to a second surface of the substrate opposite the first surface, and singulating the plurality of die after coupling the metal gang frame over the plurality of die.

Implementations of methods of forming a plurality of reinforced die may include one, all, or any of the following:

The metal gang frame and the base plate may each include copper.

The metal gang frame may be directly coupled to the substrate through either a silver sinter paste or a solder.

Coupling the metal gang frame to the first surface of the substrate and coupling the base plate to the second surface of the substrate may include heating and compressing the metal gang frame, the substrate, and the base plate.

Singulating the metal gang frame may include sawing or laser cutting.

The plurality of die may include a plurality of insulated gate bipolar transistors.

The substrate may include a thickness 75 micrometers or less.

Implementations of reinforced semiconductor substrates may include a patterned metal gang frame including a plurality of metal plates. The plurality of metal plates may be coupled to a first surface of a substrate over a plurality of die coupled to the substrate. Each metal plate of the plurality of metal plates may be coupled to at least one die of the plurality of die.

Implementations of reinforced semiconductor substrates may include one, all, or any of the following:

The plurality of die may include a plurality of insulated gate bipolar transistors.

The substrate may be less than 75 micrometers thick.

The reinforced substrate may include a base plate coupled to a second surface of the substrate. The second surface may be opposite the first surface.

The reinforced substrate may include either a solder or a silver sinter coupled between the metal gang frame and the substrate.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended reinforced semiconductor substrate will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such reinforced semiconductor substrates, and implementing components and methods, consistent with the intended operation and methods.

Figure 1:
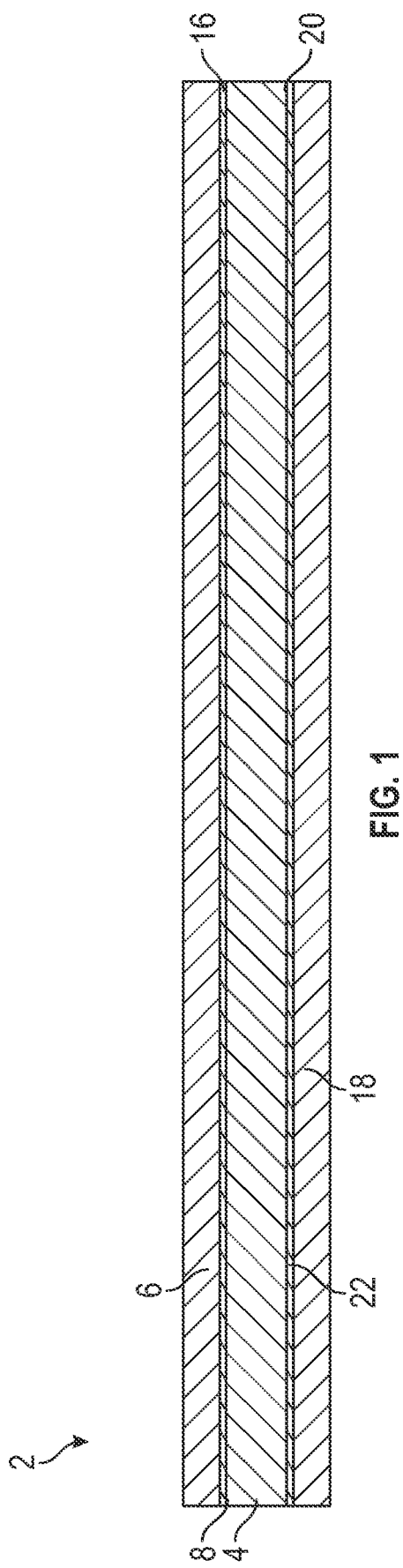
FIG. 1 is a side view of a reinforced substrate.

Referring to FIG. 1, a cross sectional side view of a reinforced substrate 2 is illustrated. The reinforced substrate includes a substrate 4. The term "substrate" refers to a semiconductor substrate as a semiconductor substrate is a common type of substrate, however, "substrate" is not an exclusive term that is used to refer to all semiconductor substrate types. Similarly, the term "substrate," may refer to a wafer as a wafer is a common type of substrate, however, "substrate" is not an exclusive term that is used to refer to all wafers. The various semiconductor substrate types disclosed in this document that may be utilized in various implementations may be, by non-limiting example, round, rounded, square, rectangular, or any other closed shape. In various implementations, the substrate 4 may include a substrate material such as, by non-limiting example, single crystal silicon, silicon dioxide, glass, gallium arsenide, sapphire, ruby, silicon-on-insulator, silicon carbide, polycrystalline or amorphous forms of any of the foregoing, and any other substrate material useful for constructing semiconductor devices. In particular implementations, the substrate may be a silicon-on-insulator substrate.

The substrate 4 includes a plurality of die therein and, more specifically, may include a plurality of die formed in the first surface 8 of the substrate. In various implementations, the plurality of die may include power semiconductor devices, such as, by non-limiting example, insulated gate bipolar transistors (IGBT), diodes, MOSFETs, or other power semiconductor devices. In other implementations, the plurality of die may include non-power semiconductor devices. In various implementations, the die of the plurality of die may be 16 mm long and 16 mm wide. In other implementations, the width and/or length of the die may be more than or less than 16 mm. In various implementations, the substrate may be as thin as 75 micrometers (µm) thick. In other implementations, the substrate may be thinner than or thicker than 75 µm.

Figure 2:
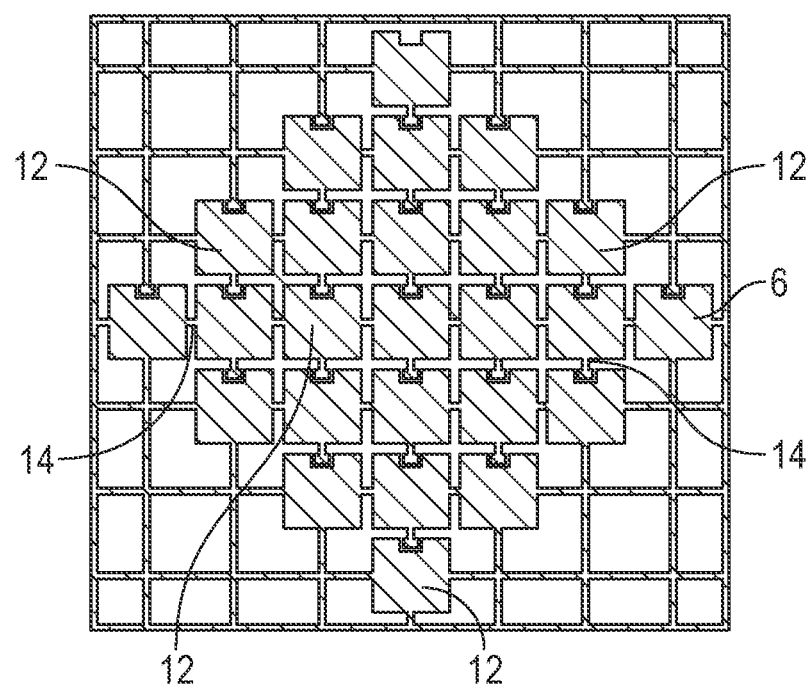
FIG. 2 is a top view of a metal gang frame.

Still referring to FIG. 1, the reinforced substrate 2 may include a metal gang frame 6 (plate) coupled to a first surface 8 of the substrate 4. The metal gang frame 6 may include, by non-limiting example, copper, gold, silver, aluminum, any other metal, any alloy thereof, and any combination thereof. In other implementations, the reinforced substrate may include an electrically conductive non-metal gang frame in place of the metal gang frame. Referring to FIG. 2, a top view of a metal gang frame is illustrated. In various implementations, the metal gang frame 6 may be patterned. In such implementations, the metal gang frame 10 may include a plurality of metal plates 12. The plurality of metal plates 12 may be coupled together through a plurality of tie bars 14. In various implementations, the plurality of plates 12 may correspond with a plurality of die within a substrate, or the plurality of plates 12 may be coupled over a plurality of die when the metal gang frame 6 is coupled to the substrate 4. In this manner, each metal plate of the plurality of metal plates is coupled to at least one die of the plurality of die. Correspond, as used in this sense, means the plurality of die are covered by a plurality of plates, or that each of the individual die of the plurality of die has a metal plate of the metal gang frame directly over the die. In various implementations, a single die may correspond to a single metal plate. In other implementations, multiple die may correspond to a single plate, meaning that more than one die may be covered by the metal plate. In particular implementations, two die may correspond with, or each be at least partially covered by, a single metal plate, three die may correspond with, or each be at least partially covered by, a single metal plate, four die may correspond with, or each be at least partially covered by, a single metal plate, or more than four die may correspond with, or each be at least partially covered by, a single metal plate.

Referring back to FIG. 1, the metal gang frame 6 may be coupled (and may be directly coupled) to the substrate 4 through an adhesive layer 16. The adhesive layer may include, by non-limiting example, a solder, a silver or other sintering material, an adhesive film, or any other adhesive or bonding material.

Figure 4:
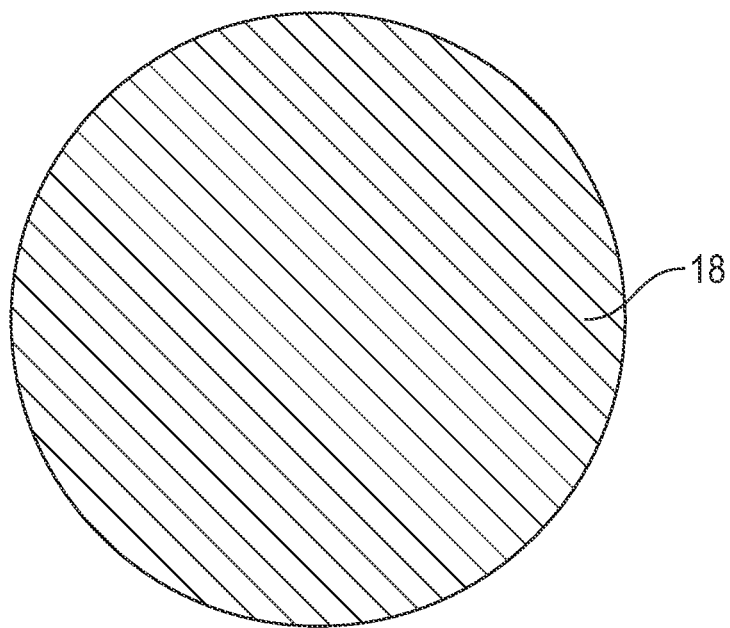
FIG. 4 is a top view of a base plate.

Still referring to FIG. 1, in various implementations the reinforced substrate 2 may include a base plate 18 coupled to the second surface 20, opposite the first surface 8, of the substrate 4. In other implementations, the reinforced substrate does not include a base plate. In implementations including the base plate, the base plate may include, by non-limiting example, copper, aluminum, gold, silver, any other metal, any alloy thereof, and any combination thereof. Referring to FIG. 4, a top view of a base plate is illustrated. In various implementations, the base plate 18 may not be patterned but may be a solid sheet corresponding to a shape and/or size of the substrate 4. In other implementations, the base plate may be patterned, and may be patterned using the same patterning as the metal gang frame. In some implementations, the base plate may be a metal gang frame. Referring back to FIG. 1, the base plate 18 may be coupled (and may be directly coupled) to the substrate 4 through an adhesive layer 22. The adhesive layer 22 may include, by non-limiting example, a solder, a silver or other sintering material, an adhesive film, or any other adhesive or bonding material.

Figure 6:
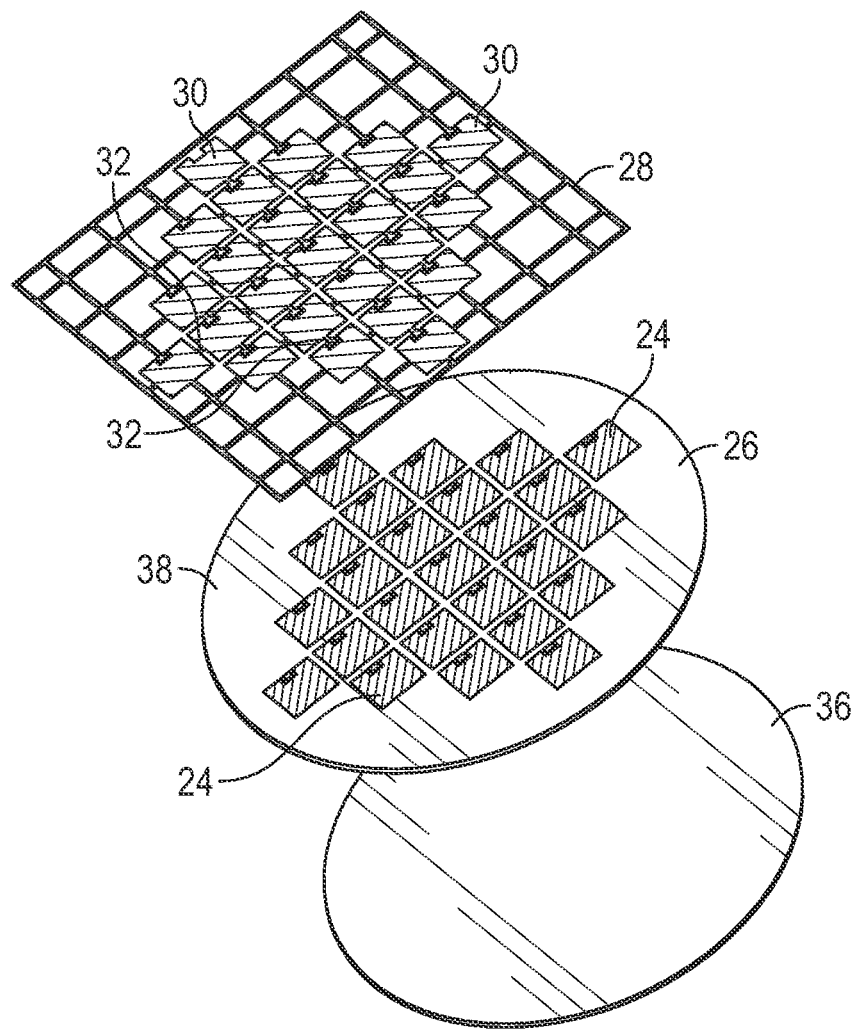
FIG. 6 is an exploded view of a reinforced substrate illustrating how a metal gang frame and a back metal plate is coupled to a substrate.

Referring to FIG. 6, an exploded view of a reinforced substrate illustrating how a metal gang frame and a base plate is coupled to a substrate is illustrated. In various implementations, a method of forming a plurality of die may include forming a plurality of die 24 on a substrate 26. The substrate 26 may include any type of substrate disclosed herein and the plurality of die 24 may include any type of die disclosed herein. The method of forming a plurality of die also includes patterning a metal gang frame 28, which may be any type of metal gang frame disclosed herein, to form a plurality of metal plates 30. The plurality of metal plates 30 may be coupled together through a plurality of tie bars 32. The plurality of metal plates 30 correspond to the plurality of die 24. Correspond, as used in this sense, means the plurality of die 24 are configured to be covered by a plurality of plates 30, or that each of the individual die of the plurality of die is configured to have a metal plate of the metal gang frame 28 directly over the die. In various implementations, a single die may correspond to a single metal plate. In other implementations, multiple die may correspond to a single plate, meaning that more than one die may be covered by the metal plate. In particular implementations, two die may correspond with, or each be at least partially covered by, a single metal plate, three die may correspond with, or each be at least partially covered by, a single metal plate, four die may correspond with, or each be at least partially covered by, a single metal plate, or more than four die may correspond with, or be covered by, a single metal plate. In various implementations, the plurality of metal plates may also correspond with the plurality of die in size and/or shape. In particular implementations, each metal plate may be the same size as the die covered by the metal plate. In other implementations, each metal plate may be slightly smaller than each die covered by the metal plate.

Figure 3:
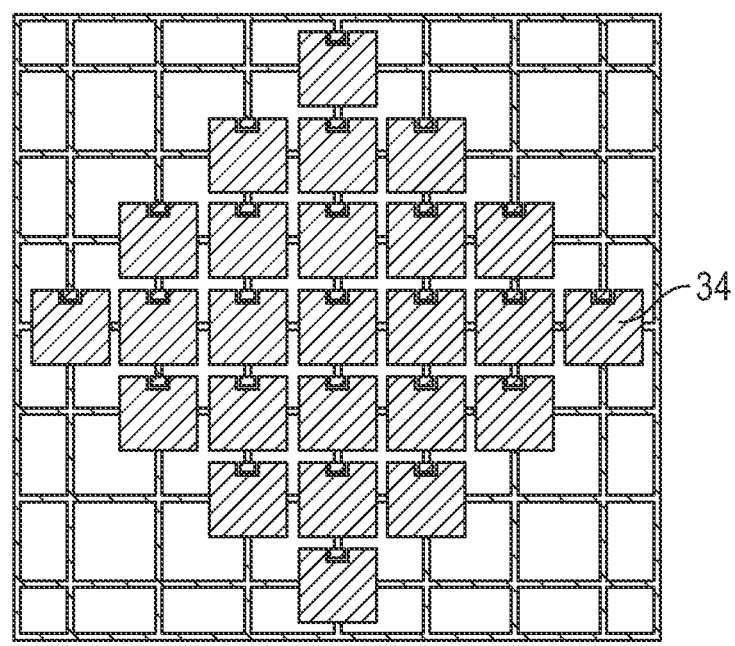
FIG. 3 is a top view of a sinter layer over the metal gang frame of FIG. 2.

The method of forming a plurality of die includes coupling the metal gang frame 28 to the first surface 38 of the substrate 26 and over the plurality of die 24. In various implementations, the metal gang frame 28 is coupled, and may be directly coupled, to the substrate through any adhesive material disclosed herein. Referring to FIG. 3, a top view of a sinter layer over the metal gang frame of FIG. 2 is illustrated. In various implementations, an adhesive layer, such as a sinter layer 34, may be formed on a side of the metal gang frame configured to be coupled to the substrate. In such implementations, the method of forming the plurality of die may include screen printing or laminating the sinter layer, or other adhesive layer, onto the metal gang frame prior to coupling the metal gang frame to the substrate.

Figure 5:
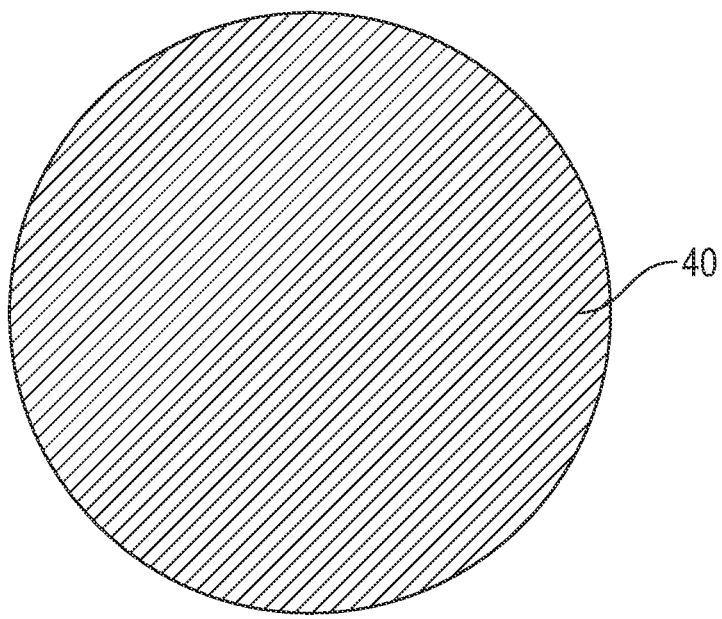
FIG. 5 is a top view of a sinter layer over the base plate of FIG. 4.

Referring back to FIG. 6, the method of forming a plurality of die may include coupling a base plate 36 to a second surface (opposite the first surface 38) of the substrate 26. In other implementations, the method of forming a plurality of die does not include coupling the base plate to the substrate. In implementations having a base plate, the base plate 36 may be any type of base plate disclosed herein. In various implementations, the base plate 36 may be coupled to the substrate using any adhesive material disclosed herein. Referring to FIG. 5, a top view of a sinter layer over the base plate of FIG. 4 is illustrated. In various implementations, an adhesive layer, such as a sinter layer 40, may be formed on a side of the metal gang frame configured to be coupled to the substrate prior to coupling the base plate to the second surface of the substrate. In such implementations, the method of forming the plurality of die may include screen printing or laminating the sinter layer, or other adhesive layer, onto the base plate.

Figure 7:
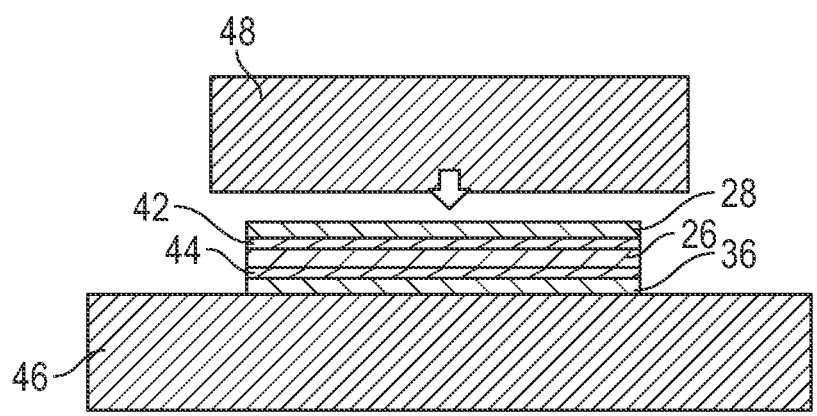
FIG. 7 is a side view of a metal gang frame and a base plate bonded to a substrate using heat and compression.

Referring to FIG. 7, a side view of a metal gang frame and a base plate bonded to a substrate using heat and compression is illustrated. In various implementations, the method of forming a plurality of die may include reinforcing the substrate 26 which may include bonding the metal gang frame 28 to the substrate 26 through an adhesive material 42 and bonding the base plate 36 to the substrate 26 through an adhesive material 44. The metal gang frame 28 and the base plate 36 may be coupled to the substrate through heating and compressing the metal gang frame 28, the substrate 26, and the base plate 36. In various implementations, and as illustrated by FIG. 7, the method may include placing the stack of the metal gang frame 28, substrate 26, and base plate 36 on a hot plate 46 (or other heated surface). The method of forming the plurality of die may include heating the metal gang frame 28, the substrate 26, and the base plate 36 through the hot plate 46 and, in various implementations, may include compressing the metal gang frame, substrate, and base plate using a pressure tool 48. In other implementations, the method may include bonding the substrate 26 to the metal gang frame 28 and the base plate 36 through heating without compression or through compression without heating.

As illustrated by FIG. 7, the method of forming the plurality of die includes forming a reinforced substrate having the metal gang frame 28 and the base plate 36 coupled to the substrate 26. In other implementations, the method may include forming a reinforced substrate having the metal gang frame coupled to the substrate and not having a base plate coupled to the substrate. In such implementations, the metal gang frame may be coupled to the substrate using the same heating, compression, or any other coupling methods disclosed herein.

Figure 8:
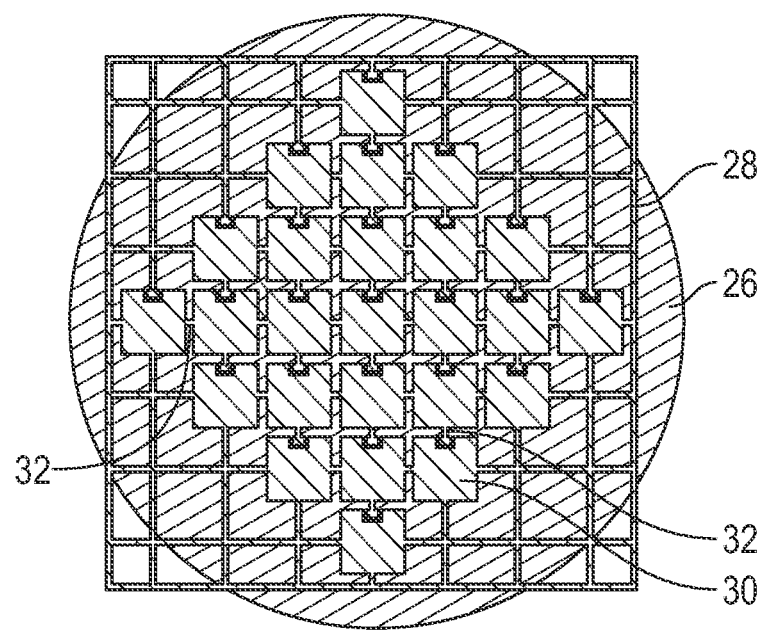
FIG. 8 is a top view of a metal gang frame bonded to a substrate.
Figure 9:
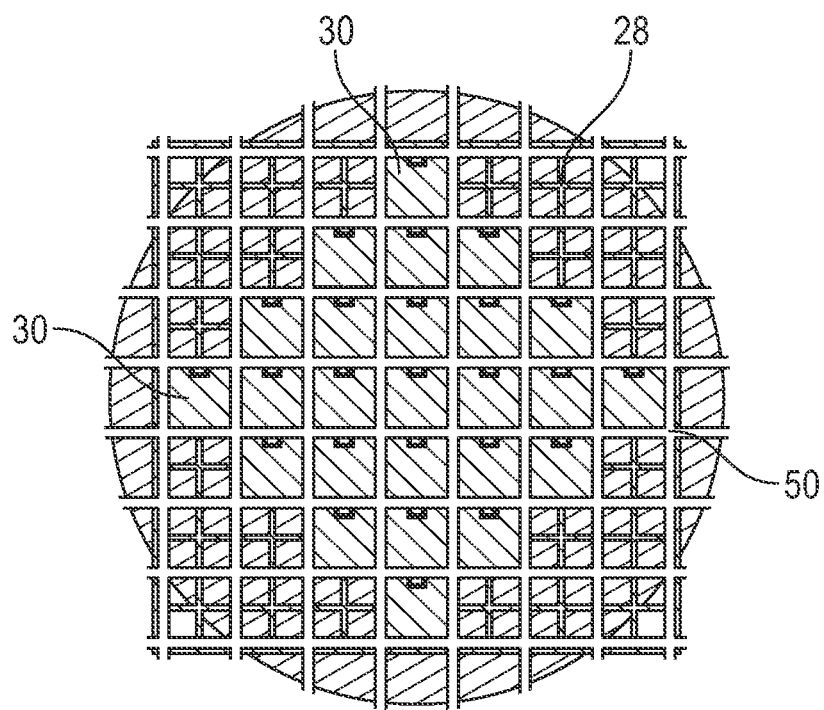
FIG. 9 is a top view of a plurality of die singulated from a substrate.

Referring to FIG. 8, a top view of the metal gang frame bonded to a substrate is illustrated and referring to FIG. 9, a top view of a plurality of die singulated from the substrate is illustrated. The method of forming a plurality of die includes singulating the plurality of die from the substrate after the metal gang frame 28 (and base plate 36, if included) are bonded to the substrate 26. Upon singulation, each die of the plurality of die may include the corresponding metal plate from the plurality of metal plates 30 coupled over the plurality of die (and a corresponding portion of the base plate, if included). Singulating may include removing substrate material from the die streets 50 in the substrate and removing portions of the tie bars 32 in the die streets 50. In various implementations, the method of forming the plurality of die may include singulating the plurality of die through sawing. In such implementations, the width of the saw blade may be the same width as the width of the spacing between the plurality of metal plates 30. In other implementations, the width of the saw blade may be less than the width of the spacing between the metal plates. In this manner, the saw blade only needs to saw through the tie bars, resulting in less of the metal gang frame migrating into the substrate during singulation of the plurality of die. In other implementations, the plurality of die may be singulated using laser ablation or cutting, jet ablation, wet etching, or plasma etching. In implementations where an etch is used to singulate the plurality of die, the metal gang frame 28 may also serve as a mask during the etch.

Figure 10:
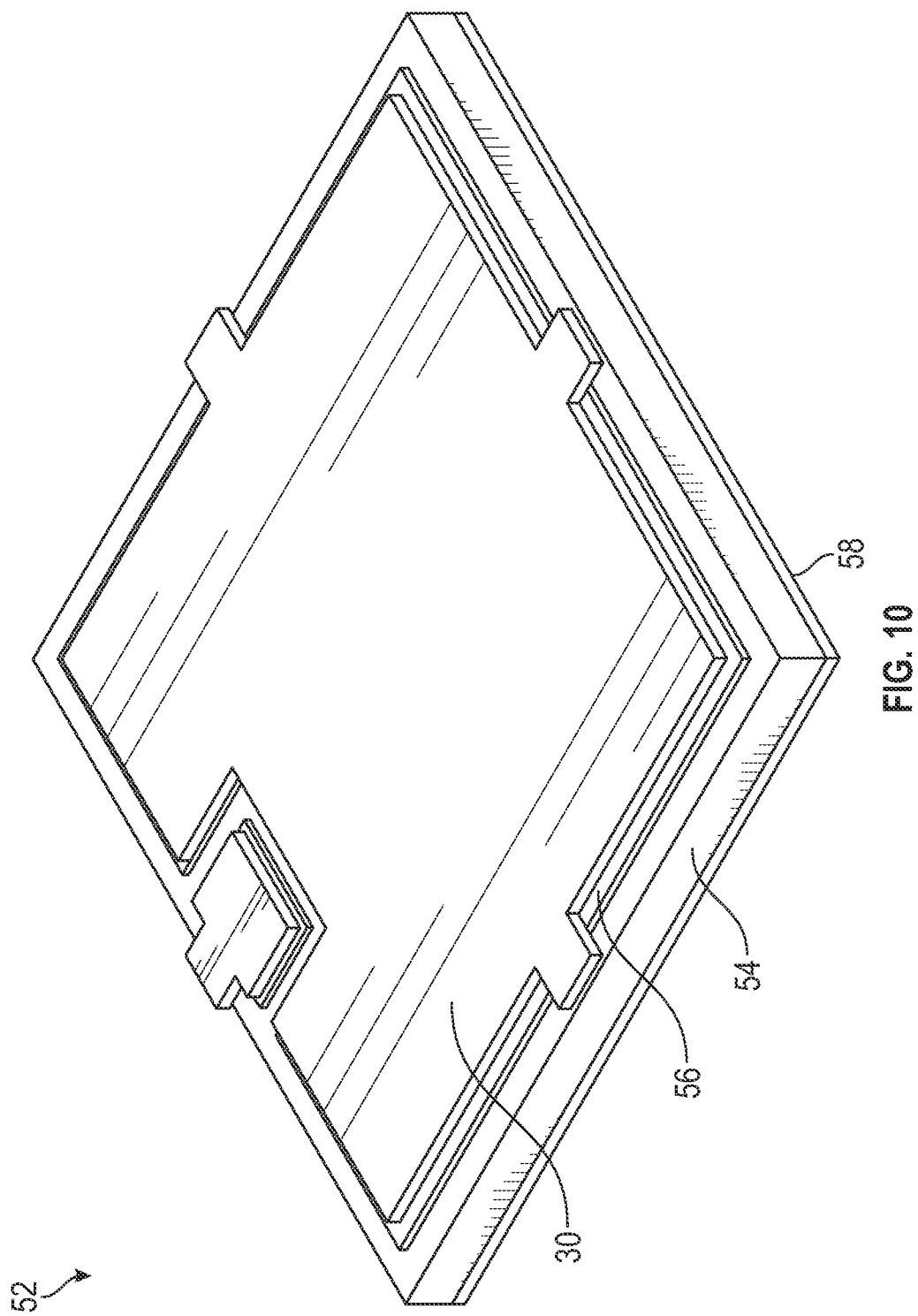
FIG. 10 is a magnified perspective view of a singulated die from the plurality of die.

Referring to FIG. 10, a magnified perspective view of a singulated die from the plurality of die is illustrated. As illustrated, the die 52 includes a portion 54 of the substrate having a die formed therein, a metal plate 30 from the metal gang frame, and a portion 56 of the adhesive layer used to couple the metal plate 30 to the portion 54 of the substrate. In this manner, the die 52 may be a reinforced die. The metal plate 30 may fortify the die 52 and reduce mechanical stress which could cause a defect, such as a crack, in the die 52. More specifically, the die 52 may now be bonded directly to thick wires, such as copper or aluminum wires through the metal plate 30. The metal plate 30 may sufficiently reinforce the die 52 to allow bonding of thicker and more reliable metal wires to the die 52. Use of heavier wires may withstand the high voltage and current passing through the semiconductor die, and in turn, enhance the semiconductor die's performance. Such a reinforcement may be especially advantageous when dealing with thinned die having a large surface area. In implementations with thinned large die, a greater amount of contact force may be required during the pick and place and/or transfer of the die. The metal plate may provide the necessary strength to withstand the increased contact force. In various implementations, the die 52 may also include a portion 58 of the base plate. In various implementations, the die 52 may be sufficiently thick and may not need the portion of the base plate 58 to support the die 52, however, in other implementations, especially implementations including thinned die, the base plate may further reinforce and stabilize the die 52.

In places where the description above refers to particular implementations of reinforced semiconductor substrates and implementing components, sub-components, methods and sub-methods, it should be readily apparent that a number of modifications may be made without departing from the spirit thereof and that these implementations, implementing components, sub-components, methods and sub-methods may be applied to other reinforced semiconductor substrates.

What is claimed is:

1. A reinforced semiconductor die comprising:
   a substrate comprising a die; and
   a metal plate coupled over the substrate, the metal plate comprising a plurality of tie bars extending from a plurality of sides of the metal plate;
   wherein the die is configured to be electrically coupled to a wire through the metal plate.

2. The reinforced semiconductor die of claim 1, wherein each tie bar extends to an outer perimeter of the substrate.

3. The reinforced semiconductor die of claim 1, further comprising a base plate coupled to a second side of the substrate, wherein the second side of the substrate is opposite a first side of the substrate facing the metal plate.

4. The reinforced semiconductor die of claim 1, wherein the substrate comprises a plurality of die.

5. The reinforced semiconductor die of claim 1, wherein the substrate is less than 75 microns thick.

6. The reinforced semiconductor die of claim 1, wherein the die comprises a power semiconductor device.

7. The reinforced semiconductor die of claim 1, wherein the reinforced semiconductor die is singulated.

8. A reinforced semiconductor die comprising:
   a substrate comprising a die; and
   a conductive plate directly coupled to a first side of the substrate through an adhesive;
   a base plate coupled to a second side of the substrate, the second side opposite the first side;
   wherein the conductive plate comprises a tie bar extending from each of four sides of the conductive plate.

9. The reinforced semiconductor die of claim 8, wherein the die is configured to be electrically coupled to a wire through the conductive plate.

10. The reinforced semiconductor die of claim 8, wherein each tie bar terminates at an outer perimeter of the substrate.

11. The reinforced semiconductor die of claim 8, wherein the substrate comprises a plurality of die.

12. The reinforced semiconductor die of claim 8, wherein the die comprises a power semiconductor device.

13. The reinforced semiconductor die of claim 8, wherein the conductive plate is set in from a perimeter of the substrate.

14. A reinforced semiconductor die comprising:
    a substrate comprising a die; and
    a metal plate directly coupled to a first side of the substrate through an adhesive;
    a base plate coupled to a second side of the substrate, the second side opposite the first side;
    wherein the metal plate comprises a tie bar extending from each of four sides of the metal plate.

15. The reinforced semiconductor die of claim 14, wherein the die is configured to be electrically coupled to a wire through the metal plate.

16. The reinforced semiconductor die of claim 14, wherein each tie bar terminates at an outer perimeter of the substrate.

17. The reinforced semiconductor die of claim 14, wherein the substrate comprises a plurality of die.

18. The reinforced semiconductor die of claim 14, wherein the die comprises a power semiconductor device.

19. The reinforced semiconductor die of claim 14, wherein the metal plate is set in from a perimeter of the substrate.

20. The reinforced semiconductor die of claim 14, wherein an outer perimeter of the base plate is the same as an outer perimeter of the substrate.

* * * * *